United States Patent [19]

Schwabe et al.

[11] Patent Number: 4,525,378

[45] Date of Patent: Jun. 25, 1985

[54] METHOD FOR MANUFACTURING VLSI COMPLEMENTARY MOS FIELD EFFECT CIRCUITS

[75] Inventors: Ulrich Schwabe, Munich; Erwin P. Jacobs, Vaterstetten; Franz Neppl, Munich, all of Fed. Rep. of Germany

[73] Assignee: Siemens Aktiengesellschaft, Berlin & Munich, Fed. Rep. of Germany

[21] Appl. No.: 617,590

[22] Filed: Jun. 5, 1984

[30] Foreign Application Priority Data

Aug. 26, 1983 [DE] Fed. Rep. of Germany ....... 3330851

[51] Int. Cl.$^3$ .............................................. B05D 3/06
[52] U.S. Cl. .................................... 427/38; 427/43.1; 427/85; 427/93; 427/94; 427/96; 427/259; 427/265
[58] Field of Search ................... 427/38, 43.5, 85, 93, 427/94, 96, 259, 265

[56] References Cited

PUBLICATIONS

Article by L. C. Parillo et al. in the Technical Digest IEDM, 1980, vol. 29.1, pp. 752–755 "Twin-Type CMOS-Technology for VLSI Circuits".
"High Packing Density High Speed CMOS Device Technology" by Sakai et al., Japanese Journal of Applied Physics, vol. 18, Supplement 18-1, pp. 73–78.

Primary Examiner—Bernard D. Pianalto
Attorney, Agent, or Firm—Hill, Van Santen, Steadman & Simpson

[57] ABSTRACT

A method for manufacturing VLSI complementary MOS field effect transistor circuits (CMOS circuits). By use of a suitable gate material, preferably a gate material comprised of silicides of high melting point metals, a threshold voltage of n-channel and p-channel CMOS-FETs having gate oxide thicknesses $d_{GOX}$ in a range of 10 to 30 nm is simultaneously symmetrically set by means of a single channel ion implantation. Given employment of tantalum silicide, the gate oxide thickness $d_{GOX}$ is set to 20 nm and the channel implantation is executed with a boron dosage of $3 \times 10^{11}$ cm$^{-2}$ and an energy of 25 keV. In addition to achieving a high low-level break down voltage for short channel lengths, this enables the elimination of a photolithographic mask. This represents an improvement with respect to yield and costs. The method serves for the manufacture of analog and digital CMOS circuits in VLSI technology.

7 Claims, 7 Drawing Figures

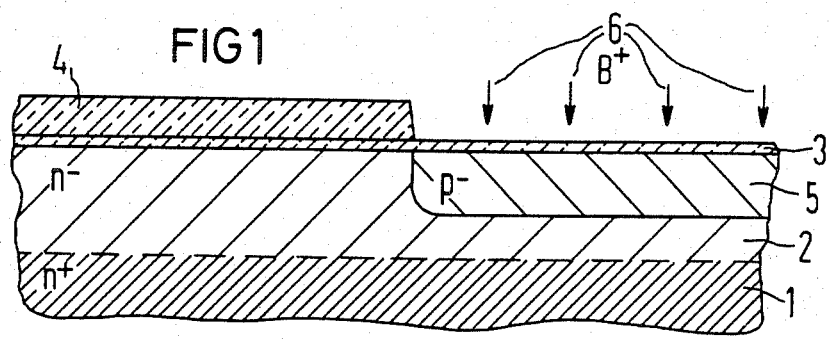
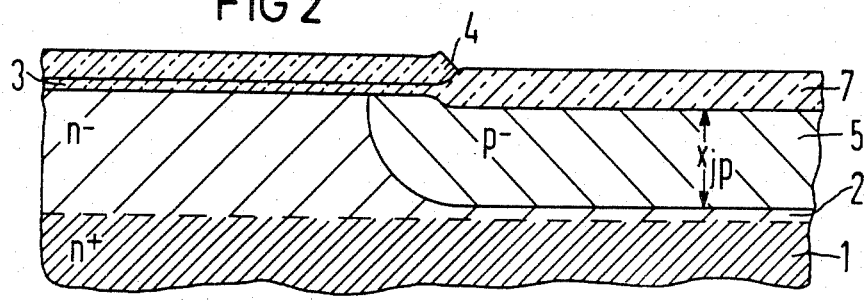
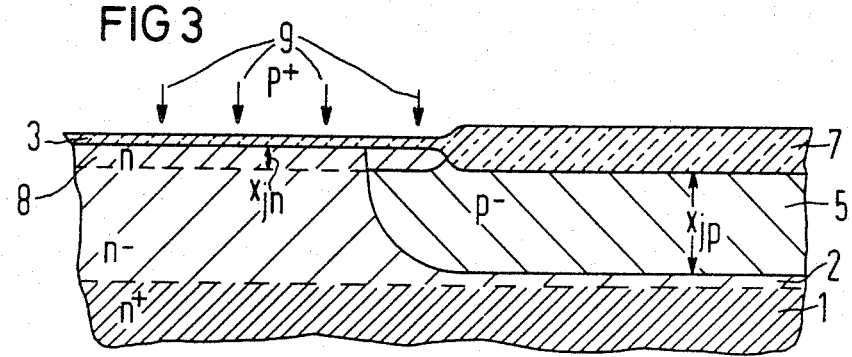
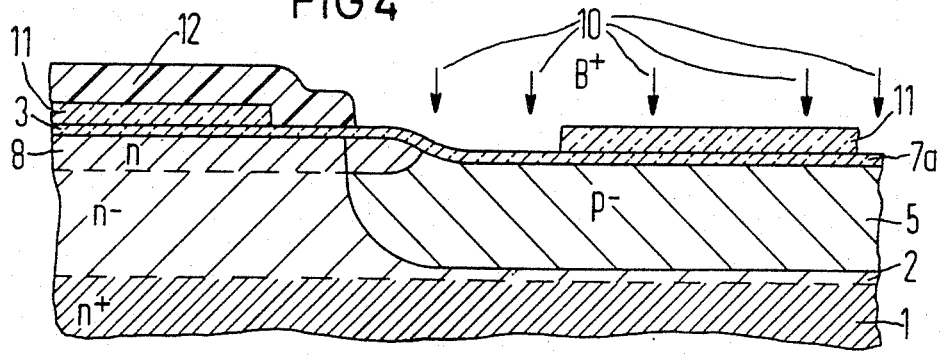

METHOD FOR MANUFACTURING VLSI COMPLEMENTARY MOS FIELD EFFECT CIRCUITS

BACKGROUND OF THE INVENTION

The invention relates to a method for manufacturing VLSI complementary MOS field effect transistor circuits (CMOS circuits) wherein p-doped or n-doped tubs are generated in the semiconductor substrate for the acceptance of the n-channel and p-channel transistors of the circuit. The corresponding dopant atoms for setting the various transistor threshold voltages are introduced into the tubs by means of ion implantations. The masking for the individual ion implantations occurs by means of photoresist structures and/or by means of silicon oxide or silicon nitride structures. The manufacture of the source, drain, and gate regions as well as the generation of the intermediate and insulating oxide and of the interconnect level is undertaken in accordance with known method steps of MOS technology.

SUMMARY OF THE INVENTION

An object upon which the present invention is based is the provision of a CMOS process wherein a symmetrical setting of the threshold voltage of n-channel and p-channel transistors having thin gate oxides can be undertaken by means of a single channel implantation with elimination of a photolithographic mask.

Modern CMOS processes employ technologies wherein both n-channel as well as p-channel transistors lie in tubs. The setting of the various transistor threshold voltages (thin oxide transistors and field oxide transistors of both types) occurs by means of multiple ion implantations matched to one another.

It is known, for instance, from an article by L. C. Parillo et al in the Techn. Dig. IEDM, 1980, 29.1, pages 752–755, incorporated herein by reference, to produce the two n-doped or p-doped tubs in a CMOS process by self-adjusting process steps by use of only one mask. Given the traditional penetration depth of 5 $\mu$m (p- and n-tub) at the implantation edge, the self-adjusting implantation of the two tubs leads to a pronounced spatial overlap and charge-wise compensation of the n-and p-implanted regions, respectively. An unwanted consequence thereof is that the threshold voltage of the field oxide transistor is reduced and the gain of the parasitic npn and pnp bipolar transistors is increased. This leads to an increased "latch up" susceptibility (i.e. the probability of triggering the parasitic thyristor).

Another method which provides for both the implantation of the two tubs as well as the channel and field implantation upon employment of separate masks is known from an article by Y. Sakai et al in the Jap. J. Appl. Phys., 18, Suppl. 18-1, pages 73–78, incorporated herein by reference. The disadvantage of this method is that the CMOS production process which is already very critical per se with respect to yield is heavily burdened due to the number of required mask steps.

A CMOS process may be derived from DE-OS No. 31 49 185, incorporated herein by reference, wherein the p-tub is implanted before the n-tub and is diffused in deeper than the n-tub in order to avoid a pronounced spatial overlap at the implantation edge of the two n-doped or p-doped tub regions. The n-tub only has a slight penetration depth. Given this method, the transistor threshold voltage for both transistor types is simultaneously set by means of a single channel implantation. The gate oxide thickness $d_{GOX}$ is on the order of 40 nm and limits the method to this relatively small range of gate oxide thickness. Lower threshold voltages result when changing to thinner gate oxide thicknesses given constant material parameters. If the threshold voltage is to be kept constant, then either a higher doping of the basic material in the channel region or a change of the gate material are required. In mose instances, the threshold voltage of the one transistor type is boosted but that of the other is lowered given a simultaneous doping of the channel regions of the n-channel and p-channel transistors.

The invention achieves the objective of a symmetrical setting of the threshold voltage of the two n-channel and p-channel transistors having gate oxide thicknesses <40 nm by means of a single channel implantation in such manner that (a) a high melting point metal or a metal silicide is employed as a gate material, the work function $\phi_M$ thereof being higher than that of the known n$^+$-polysilicon gate material, whereby $\phi_M$ is matched to the gate oxide thickness $d_{GOX}$;

(b) the gate oxide thickness $d_{GOX}$ is set to values in the range from 10 through 30 nm; and (c) a single, common channel implantation is executed for p-channel and n-channel transistors, said channel implantation being matched such that, with a given gate oxide thickness $d_{GOX}$, the threshold voltages of n-channel and p-channel transistors are symmetrical and have a prescribed value.

This is possible since the compensated p-channel transistor in the double-tub CMOS process demonstrates only an insignificant dependency on the gate oxide thickness as a consequence of its charge neutrality in the channel region. In balance with the doping of the two tube, the channel implantation can be set such that symmetrical threshold voltages result for n-channel and p-channel transistors.

The invention thus proceeds from the perception that the threshold voltage $U_T$ of an MOS transistor is essentially defined by the work function $\phi_M$ of the gate material and by the gate oxide thickness. In the normal case, the threshold voltage is set by means of a change in the base material concentration as a consequence of a designated channel implantation given the same gate material and a constant oxide thickness.

Due to the possibility in the execution of only a single channel implantation according to the teaching of the invention, a photolithographic mask is eliminated during the process. This represents a significant improvement with respect to yield and costs. Deriving as a further advantage of the method according to the teaching of the invention are reduced sub-threshold currents for short channel lengths (<0.5 $\mu$m) and thus a high dielectric strength, since the dose of the channel implantation can be kept slight.

It is provided in a further development of the invention that the silicides of the metals tantalum, titanium, molybdenum, or tungsten be employed as gate material. The gate material is thus selected such that its electron affinity differential is matched to the gate oxide thickness $d_{GOX}$.

A CMOS process with the use of tantalum silicide (TaSi$_2$) as the gate material and a gate oxide thickness of 20 nm shall be described in greater detail below with reference to FIGS. 1 through 7.

BRIEF DESCRIPTION OF THE DRAWINGS

FIGS. 1 through 7 show the structures obtained by means of the individual method steps in cross-sections, and wherein a plurality of process sequences are shown in each figure for the sake of simplicity.

DESCRIPTION OF THE PREFERRED EMBODIMENTS

Figure 5:
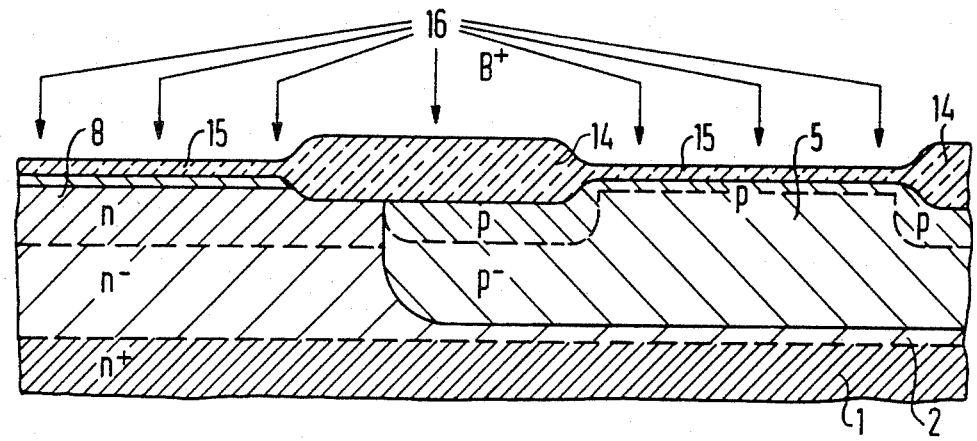

The same reference characters apply to identical parts in all figures.

In FIG. 1, the p-tub 5 is produced at the beginning of the process sequence. The starting point is thus an n+-doped substrate 1 (<100>-Si, 0.01 to 0.02 Ωcm) provided with an n-doped epitaxial layer 2 (<100>-Si, 20 Ωcm). The substrate 1 is provided with an oxide layer 3 (50 nm) and with a 140 nm thick silicon nitride layer 4 that is structured with the assistance of a photoresist technique (not shown). The boron ion implantation 6 for generating the p-tub occurs with a dosage and energy of $1.5 \times 10^{12}$ cm$^{-2}$ and 160 keV.

In FIG. 2 an oxidation process follows after the stripping of the oxide layer 3, whereby an underetching of the silicon nitride layer 4 is carried out. The newly generated oxide layer is referenced 7 and has a thickness of 500 nm. The boron ions are diffused into the epitaxial layer 2 to a penetration depth $x_{jp}$ of 6 μm in a following diffusion process. The thickness of the epitaxial layer 2 is 7 μm.

In FIG. 3 the silicon nitride layer 4 is removed. The production of the n-tub 8 occurs by means of a surface-wide phosphorous ion implantation 9 having an implantation dosage and energy of $7 \times 10^{11}$ cm$^{-2}$ and 160 keV, and a subsequent indiffusion up to a penetration depth $x_{jn}$ of 1 to 1.5 μm. As a consequence of the high implantation dosage, the field ion implantation for setting the threshold voltage of the p-channel thick oxide transistors, and thus an additional mask can be eliminated.

In FIG. 4 after the phosphorous ions for the n-tub 8 have been driven in, the oxide layer is etched off and this is followed by the oxidation of the layer 7a (50 nm) and by the silicon nitride deposition 11 to a layer thickness of 120 nm and by the structuring of the silicon nitride layer (LOCOS mask). The field implantation of the p-tub 5 with boron ions occurs after the masking of the n-tub 8 and of the entire transistor region of the n-channel transistors in the p-tub 5 with the silicon nitride layer 11. All regions except the p-tub regions are covered with a photoresist structure 12 during the boron ion implantation 10. The implantation dosage and energy of the boron ion implantation 10 are set to $1.2 \times 10^{13}$ cm$^{-2}$ and 25 keV.

In FIG. 5 after removal of the photoresist structure 12, the field oxide regions 14 are generated in a layer thickness of 1000 nm by means of local oxidation upon employment of the silicon nitride layer 11 as a masking. A thermal oxidation of the entire surface occurs after the silicon nitride layer 11 has been stripped, whereby the thickness of the gate oxide layer 15 is set at 20 nm (lower than in standard CMOS processes). This is followed by a surface-wide boron ion implantation 16 for doping the p-channel and n-channel, whereby the implantation dosage matched to the other implantations, the gate oxide thickness, and the electron affinity of the gate material comprising tantalum silicide, is set such that a symmetrical threshold voltage $U_T$ is achieved for the n-channel and the p-channel transistor. In the exemplary embodiment, the implantation dosage and energy are set to $3 \times 10^{11}$ boron cm$^{-2}$ and 25 keV, this corresponding to a threshold voltage $(U_T) = 0.7$ V given channel lengths <3μm. Since the ion implantation occurs in surface-wide fashion, a mask is not required, in contrast to other CMOS processes.

Figure 6:
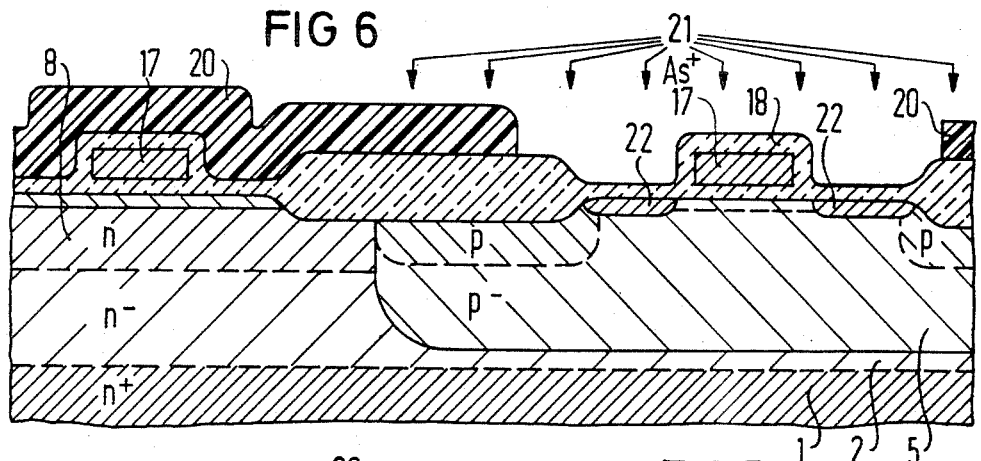

In FIG. 6, the deposition of the tantalum silicide layer to a layer thickness of 300 nm and its structuring now occur, the gate regions 17 being thus generated. The entire surface is then covered with an oxide layer 18.

This oxide deposition is managed such that the oxide layer thickness over the source/drain regions does not mask the layer source/drain implantation. After the application of a photoresist structure 20 which covers the regions of the p-channel transistors in the n-tub 8 has been accomplished, the phosphorus ion implantation 21 is carried out with a dosage of $6 \times 10^{15}$ cm$^{-2}$ and an energy of 80 keV, and the source/drain regions 22 of the n-channel transistors are generated.

Figure 7:
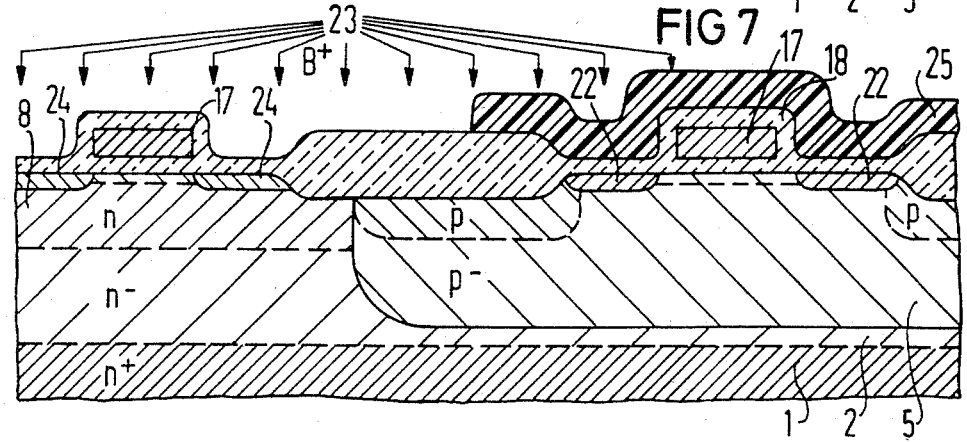

In FIG. 7 a further photoresist structure 25 which assures an adequate masking in the later boron implantation 23 for generating the p-channel transistors, is produced in the thermal oxidation following the arsenic ion implantation 21, the source/drain regions 22 of the n-channel transistors also being driven in during the thermal oxidation. The boron ion implantation 23 for generating the source/drain regions of the p-channel transistors in the n-tub 8 is carried out with a dosage and energy of $4 \times 10^{15}$ cm$^{-2}$ and 25 keV. The source/drain regions 24 of the p-channel transistors arise after the implanted boron atoms have been driven in.

The production of the insulating layer, of the contact hole regions, and of the metal interconnect level occur according to known method steps of CMOS technology.

The threshold voltage of the n-channel and p-channel transistors can be simultaneously set by means of a single channel implantation due to the employment of tantalum silicide gates in combination with a gate oxide thickness of 20 nm. The separation of the n and p tubs in this self-adjusting process sequence is achieved by means of setting the different penetration depths of the n-tub and p-tub. As a result thereof, the critical spacing between n+ and p+ diffusion can be reduced from 12 μm to 6 μm without the "latch up" susceptibility being increased. Given identical channel lengths, 25% shorter switching times were achieved (measured at 3-input NAND/NOR ring oscillators).

Although various minor changes and modifications might be proposed by those skilled in the art, it will be understood that we wish to include within the claims of the patent warranted hereon all such changes and modifications as reasonably come within our contribution to the art.

We claim as our invention:

1. A method for manufacturing VLSI complementary MOS field effect transistor circuits (CMOS circuits) wherein p-doped or n-doped tubs are generated in a semiconductor substrate for acceptance of the n-channel and p-channel transistors of the circuits, corresponding dopant atoms for setting various transistor threshold voltages being introduced into the tubs by ion implantation, a masking being provided for the individual ion implantations, and a manufacture of the source, drain, and gate regions as well as a generation of an intermediate and insulating oxide and of an interconnect level being provided, wherein the improvement comprises the steps of:

(a) employing a gate material having a work function $\phi_M$ higher than n+-polysilicon gate material, the work function $\phi_M$ being matched to a thickness of a gate oxide thickness $d_{GOX}$;

(b) setting the gate oxide thickness $d_{GOX}$ to values in a range from 10 to 30 nm; and (c) executing a single, common channel ion implantation for p-channel and n-channel transistors, said channel ion implantation being matched such that, with a given gate oxide thickness $d_{GOX}$, threshold voltages of n-channel and p-channel transistors are symmetrical and have a given value.

2. A method according to claim 1 wherein the gate material comprises a high melting point metal.

3. A method according to claim 1 wherein the gate material comprises a metal silicide.

4. A method according to claim 1 wherein silicides of metals selected from the group tantalum, titanium, molybdenum and tungsten are employed as said gate material.

5. A method for manufacturing a CMOS circuit according to claim 1, including the steps of using n-doped silicon base material as the bases and tantalum silicide as the gate material; and:

(a) manufacturing the p-tub with a boron ion implantation in the n-doped substrate covered with an oxide layer after masking remaining regions with a silicon nitride mask;

(b) executing a local oxidation process and in-diffusion of boron ions;

(c) stripping the silicon nitride masking;

(d) manufacturing the n-tub with a phosphorous ion implantation and subsequent in-diffusion of phosphorous ions;

(e) executing a field implantation for the n-channel transistors in the region of the p-tub after masking of the n-tub by means of a silicon nitride and photoresist layer, and masking an entire transistor region of the n-channel transistor in the p-tub with a silicon nitride layer;

(f) manufacturing field oxide regions by means of local oxidation by use of a silicon nitride layer as a masking;

(g) providing a thermal oxidation of the entire surface after stripping of the silicon nitride masking up to a gate oxide thickness $d_{GOX}$ of approximately 20 nm;

(h) providing a surface-wide boron ion implantation for doping of the n-channel and of the p-channel with a dosage of 1 to $4 \times 10^{11}$ cm$^{-2}$ and an energy of 5-60 keV;

(i) depositing and structuring tantalum silicide for formation of the gate regions;

(j) providing a surface-wide deposition of an oxide layer in such a thickness that the later source/drain implantations of the n-channel and p-channel transistors are not masked;

(k) executing a photoresist technique whereby all regions except the p-tub regions remain covered with photoresist;

(l) executing a phosphorous ion implantation for production of the source/drain regions of the n-channel transistors and stripping of the photoresist structures;

(m) executing a further photoresist technique whereby all regions except the n-tub regions remain covered with photoresist;

(n) executing a boron ion implantation for production of the source/drain regions of the p-channel transistors and stripping of the photoresist structures; and (o) providing the insulating layer, the contact hole regions, and the metal interconnect structure.

6. A method according to claim 5 including the step of employing as a substrate n-doped silicon oriented in a (100)-direction and having an epitaxial layer on an n+-doped silicon substrate having a conductivity of 0.01 through 0.02 $\Omega$cm.

7. A method according to claim 5 including the step of executing the boron ion implantation according to method step (a) with a dosage of $1.5 \times 10^{12}$ cm$^{-2}$ and an energy of 160 keV, and executing the phorphorous ion implantation according to method step (e) with a dosage of approximately $7 \times 10^{11}$ cm$^{-2}$ and an energy of 160 keV.

* * * * *